United States Patent [19]

McKenny et al.

[11] 4,301,535
[45] Nov. 17, 1981

[54] PROGRAMMABLE READ ONLY MEMORY INTEGRATED CIRCUIT WITH BIT-CHECK AND DEPROGRAMMING MODES AND METHODS FOR PROGRAMMING AND TESTING SAID CIRCUIT

[75] Inventors: Vernon G. McKenny, Carrollton; John K. Hampton, Lewisville, both of Tex.

[73] Assignee: Mostek Corporation, Carrollton, Tex.

[21] Appl. No.: 53,880

[22] Filed: Jul. 2, 1979

[51] Int. Cl.³ ............................................. G01R 31/28
[52] U.S. Cl. ...................................... 371/21; 365/185; 324/211
[58] Field of Search .................... 371/21, 28; 365/200, 365/201, 185; 324/73 R, 210, 211; 307/238

[56] References Cited

U.S. PATENT DOCUMENTS

| | | |
|---|---|---|
| 3,744,036 | 7/1973 | Frohman-Bentchkowsky ... 365/185 |
| 3,795,859 | 3/1974 | Benante et al. ........................ 371/28 |
| 4,061,908 | 12/1977 | de Jonge et al. ..................... 371/21 |
| 4,122,544 | 10/1978 | McElroy ............................. 365/185 |
| 4,161,039 | 7/1979 | Rossler ................................ 365/185 |
| 4,169,291 | 9/1979 | Rossler ................................ 365/185 |
| 4,172,291 | 10/1979 | Owens et al. ........................ 307/238 |
| 4,179,626 | 12/1979 | Oehler ................................. 397/238 |
| 4,181,980 | 1/1980 | McCoy ............................... 365/185 |

*Primary Examiner*—Charles E. Atkinson

[57] ABSTRACT

A programmable read only memory (PROM) integrated circuit is constructed with two new operating modes: a bit-check mode and a deprogramming mode. In the bit-check mode, circuitry is provided to readily determine the apparent threshold voltage of each programmable transistor within the PROM. In the deprogrammable mode, circuitry is provided to simultaneously subject all programmable transistors within the PROM to a deprogramming stress. The bit-check mode provides a rapid programming method, and the bit-check mode and deprogramming mode are utilized in conjunction with each other to provide a rapid and thorough testing method.

10 Claims, 11 Drawing Figures

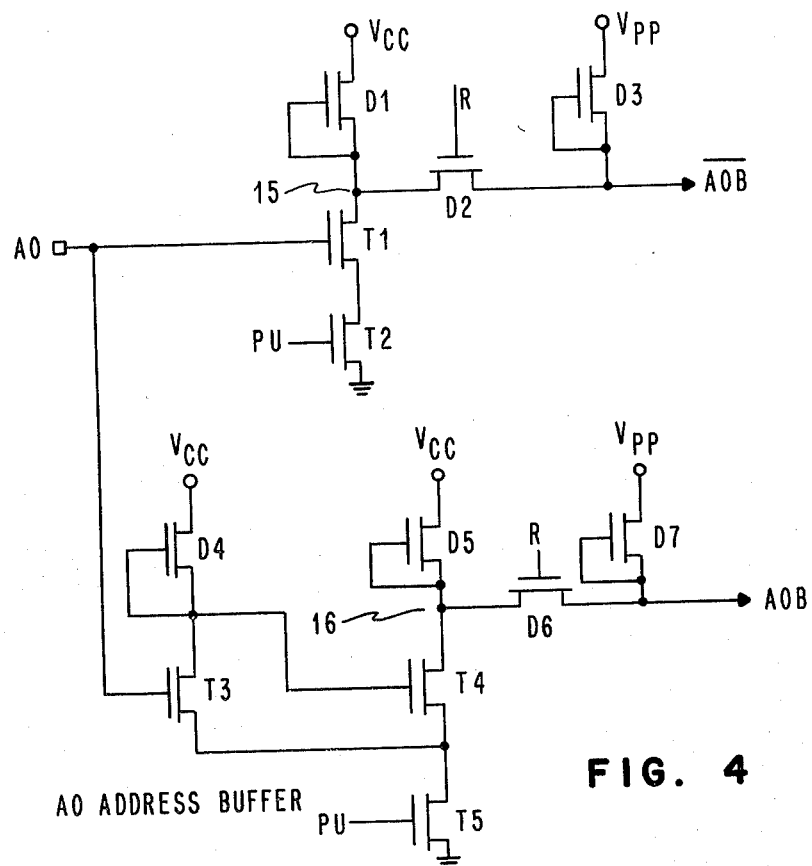
FIG. 4
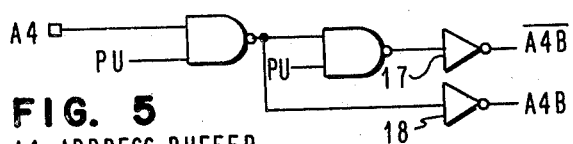
FIG. 5
A4 ADDRESS BUFFER
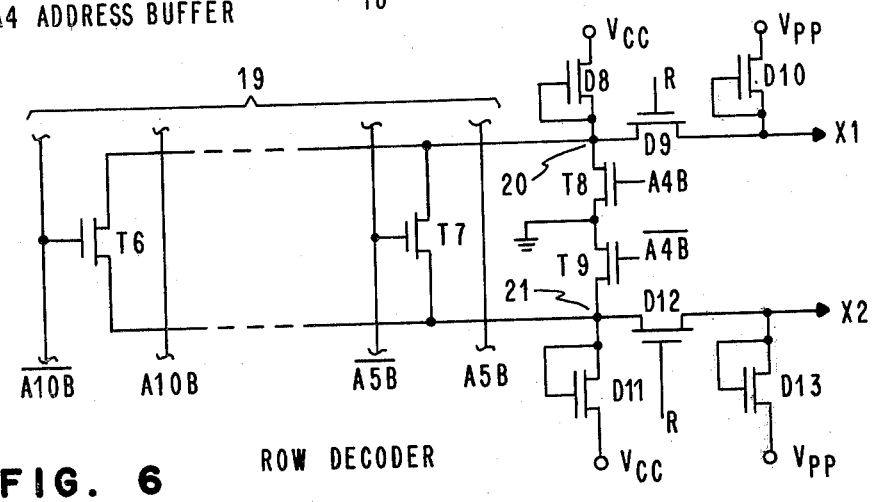
FIG. 6  ROW DECODER

PROGRAMMABLE READ ONLY MEMORY INTEGRATED CIRCUIT WITH BIT-CHECK AND DEPROGRAMMING MODES AND METHODS FOR PROGRAMMING AND TESTING SAID CIRCUIT

BACKGROUND OF THE INVENTION

1. Field of the Invention

The invention relates to the field of integrated circuits, and particularly to electrically programmable read only memories.

2. Prior Art

Electrically programmable read only memory integrated circuits are well known to the art. See, for example, U.S. Pat. Nos. 3,660,819 (1972), 3,744,036 (1973), and 3,755,721 (1973).

A widely-used structure for this type of memory is illustrated by the ultraviolet erasable 2048×8 PROM known in the electronics industry as the 2716. The 2716 contains 16,384 floating-gate MOS transistors arranged in a matrix of rows and columns. Each floating gate transistor actually has two gates, the floating gate and a second gate which is connected to one of a plurality of row-select lines. The floating gate is insulatively disposed between the second gate and the channel of the transistor. The storage of a binary 0 or 1 is determined by the "apparent threshold voltage" of the transistor, the apparent threshold voltage being the value of voltage required to be applied to the second gate so as to cause a conductive channel to be established between the drain and source of the transistor. When no excess electrical charge is stored on the floating gate, the apparent threshold voltage of a typical transistor is +2V, a value which allows the channel to become quite conductive when +5V is applied to the second gate via the row-select line. But if sufficient excess electrical charge is stored on the floating gate, the apparent threshold voltage of the transistor increases to a value greater than +5V, e.g. +8V. With such a high apparent threshold voltage, the channel will not become conductive when +5V is applied to the second gate. To read an addressed bit, circuitry connected to the drain of the addressed transistor is utilized to detect whether or not the transistor is conductive. Thus, the storage of a 0 or a 1 is dependent upon the presence of or lack of excess electrical charge on the floating gate, the presence of charge resulting in the storage of a 0 and the lack of charge resulting in the storage of a 1.

Ideally, charge "programmed" onto a floating gate will remain trapped on that gate until "erased" by exposure of the transistor to ultraviolet light. It is also desirable that sufficient charge be trapped so as to create a margin of safety between the apparent threshold voltage and the row-selection voltage when reading. The programming time required to insure that sufficient charge is trapped may vary from one storage transistor to another. Nevertheless, manufacturers of floating-gate PROMs typically recommend that each 0 bit be programmed for at least 45 milliseconds. But this time is much longer than is necessary for many devices. The present invention provides a practical means for readily determining the apparent threshold voltage of each of the programmable transistors within a PROM, allowing a faster method of programming to be utilized. This faster method of programming is described in detail in the description of the preferred embodiments.

Also, the act of programming a 0 into a selected transistor often causes previously programmed transistors in the same row to lose some percentage of their stored charge, thus lowering the apparent threshold voltage of previously programmed transistors. This deleterious effect is called "deprogramming." If too much charge is lost, the apparent threshold voltage becomes too marginal for reliable operation. To alleviate this problem, manufactures of floating gate PROMs typically specify that each 0 bit be programmed for no longer than 55 milliseconds. In addition, some transistors within a PROM may exhibit a marginal threshold voltage for reasons other than the deprogramming effect. In the prior art, there is no convenient means to test for marginal programming; hence, there is no practical means to insure reliable operation. Prior art testing typically consists only of programming various bit patterns into the PROM and operating the PROM at worst case operating voltages.

However, the present invention provides a means for simultaneously subjecting all programmable transistors within a PROM to a deprogramming stress, thus reducing the number of bit patterns which must be programmed into the PROM for testing. The present invention further provides a means for readily and accurately determining the margin of safety of threshold voltage of each programmable transistor within the PROM. Consequently, a more reliable operation is accomplished.

SUMMARY OF THE INVENTION

A programmable read only memory integrated circuit (PROM) is described with various circuit and logic modifications over the prior art to allow two new modes of operation: a bit-check mode and a deprogramming mode. The present invention provides circuitry for readily measuring the apparent threshold voltage of each programmable transistor within a PROM, and also allows all of the programmable transistors within a PROM to be simultaneously subjected to a deprogramming stress. Finally, more rapid programming and more rapid and thorough testing of a PROM is achieved.

BRIEF DESCRIPTION OF THE DRAWINGS

FIG. 4 is a circuit diagram of the A0 address buffer of FIG. 1.

FIG. 5 is a logic diagram of the A4 address buffer of FIG. 1.

FIG. 6 is a circuit diagram of a portion of the row decoder of FIG. 1.

DESCRIPTION OF THE PREFERRED EMBODIMENTS

Although the preferred embodiments are described in terms of a 2048×8 floating-gate N-channel programmable read only memory integrated circuit, it will be appreciated that the array size, the particular sense amplifier utilized, transistor sizes, specific voltages, and many other details are not critical to the invention but are disclosed in order that a full understanding of the invention may be obtained. For example, the inventive concepts are equally applicable to an 8192×8 PROM which utilizes a different sense amplifier. In addition, it will be appreciated that the present invention may be applied with appropriate modifications to programmable read only memories utilizing other MOS technologies such as to P-channel PROMs and to metal-nitride-oxide-semiconductor PROMs.

BLOCK DIAGRAM

Figure 1:
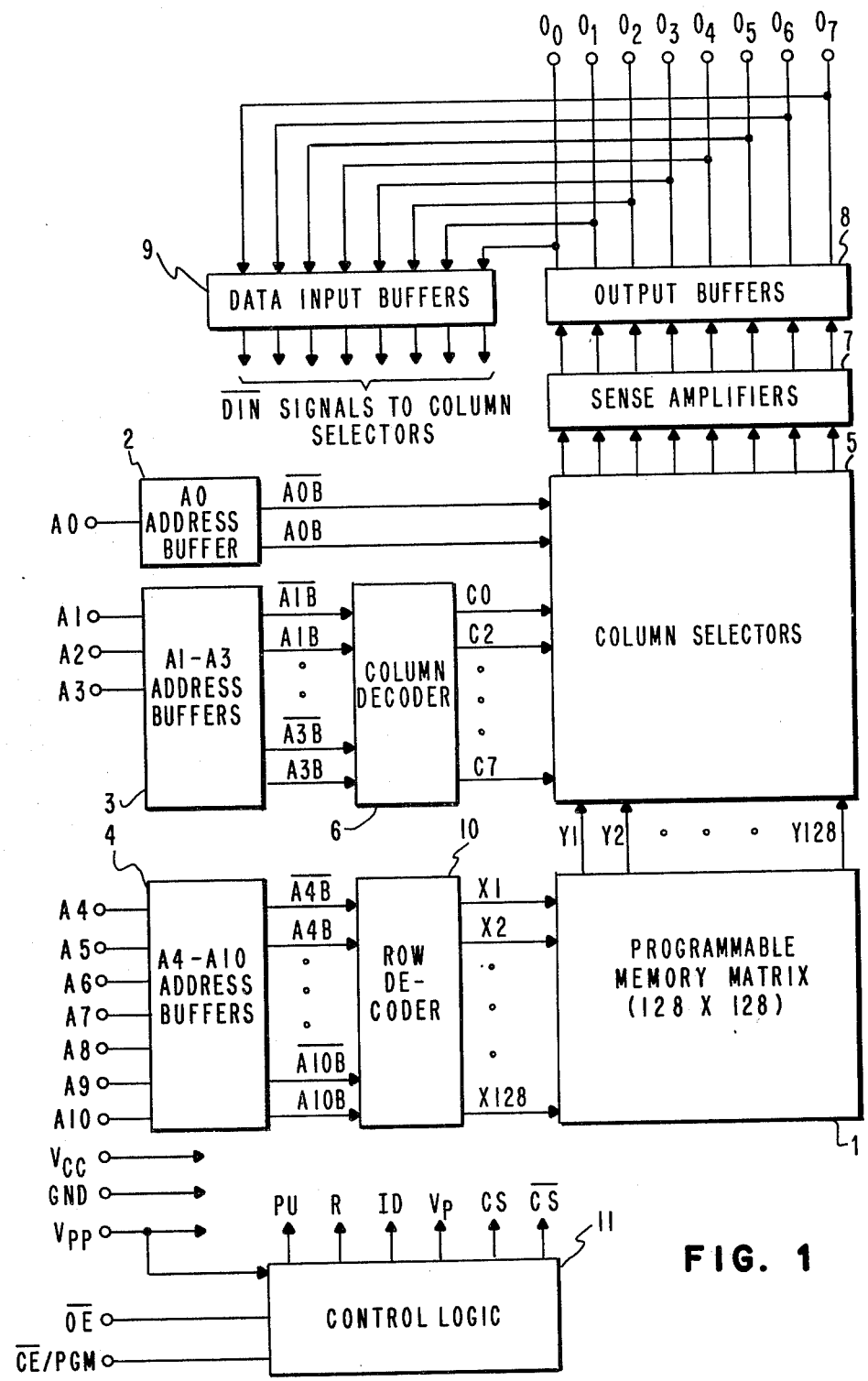
FIG. 1 is a block diagram of a 2048×8 programmable read only memory.

FIG. 1 illustrates a block diagram of a programmable read only memory showing the present invention. The programmable memory matrix 1 is comprised of a floating-gate transistors arranged in a matrix of 128 rows by 128 columns. (Note that the block diagram illustrates functionality, not actual topological layout of the integrated circuit. For example, the matrix may be topologically bisected by the row decoder, thus appearing to the eye as two matrices, although the functionality is that of one matrix.) As described in the discussion of the background of the invention, each programmable transistor within the matrix has two gates, one of which is a floating gate for charge-storing purposes.

The second gate of each programmable transistor in a row is connected to one of 128 row lines for addressing purposes. The second gate is also referred to by the term "control gate". The drains of 128 programmable transistors in each column are connected to a column line and the sources of all programmable transistors are connected to ground.

Address buffers 2, 3 and 4 interface external signal levels to levels required within the integrated circuit and generate complement signals. There are 11 external address inputs, labeled A0 through A10, applied to the address buffers thus providing a total of 2048 possible address combinations. External address A0 is applied to address buffer 2, addresses A1 through A3 to address buffers 3, and addresses A4 through A10 to address buffers 4. Thus outputs of address buffer 2 are applied to a group of eight column selectors 5, the outputs of address buffers 3 to a one-of-eight column decoder 6, and the outputs of address buffers 4 to a one-of-128 row decoder 10.

Each of the eight column selectors is a multiplexer which selects one of 16 column lines for programming or for connection to an associated sense amplifier for reading. The function of the sense amplifier is to detect whether or not an addressed programmable transistor is conductive; that is, to detect which binary state is stored. The outputs of sense amplifier group 7 are connected to the group of eight output buffers 8. The function of each output buffer is to interface the internal signal levels to external circuitry via terminals $0_0$ through $0_7$. The terminals $0_0$ through $0_7$ also serve as data inputs when the integrated circuit is in the programming mode. The programming mode is the mode of operation during which binary 0's may be selectively "written" into the programmable memory matrix. The output buffers are disabled when the integrated circuit is in the programming mode. A group of eight data input buffers 9 interface external data input signal levels to levels required within the integrated circuit.

The present invention provides two new ways in which the functional blocks are made to interact with one another; one new way of interaction being hereby defined as the bit-check mode, and the other new way being defined as the deprogramming mode. To accomplish these new modes of operation the control logic 11 has been changed over the prior art. In the bit-check mode, the functional blocks are made to interact in such as way that the apparent threshold voltage of each programmable transistor within the memory matrix can be readily measured. In the deprogramming mode, the functional blocks are made to interact in such a way as to allow a deprogramming stress to be simultaneously applied to all programmable transistors within the memory matrix. By utilizing these two new modes of operation, improved methods of programming and testing of PROMs are accomplished.

OPERATING MODES

Figure 2:
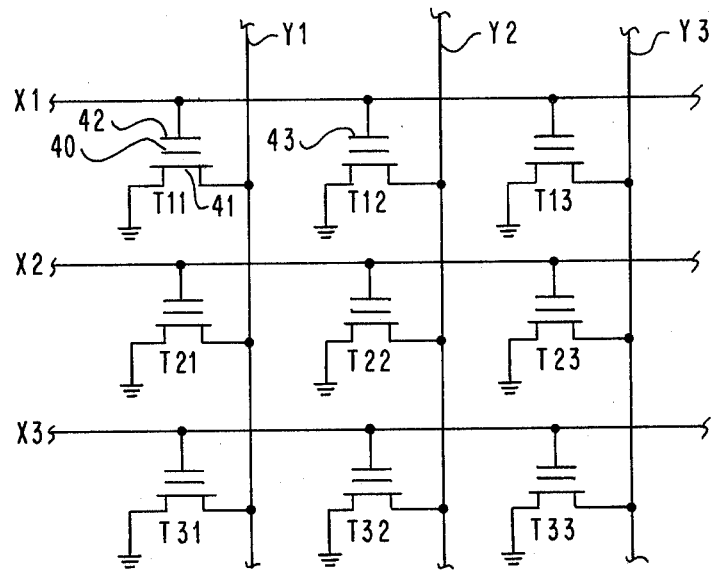
FIG. 2 is a circuit diagram of a portion of the programmable memory matrix of FIG. 1.

To aid in the following discussion of prior art operating modes and the new operating modes, reference is made to FIG. 2. The X-Y matrix of FIG. 2 is representative of a portion of the programmable memory matrix of FIG. 1. The X1, X2 and X3 lines are row-select lines while Y1, Y2 and Y3 are column lines. The nine transistors T11 through T33 are floating-gate programmable transistors, each of which comprises a memory bit.

Erase Mode

All bits may be made to store a binary 1 by exposing the programmable transistors to high intensity ultraviolet light while no voltages are applied to the matrix. This procedure, called erasing, causes negative charge which may have previously been stored on a floating gate such as 40 to be removed. After erasure, each of the transistors exhibits an effective threshold voltage of approximately +2V.

Program Mode

Binary 0's can be selectively written into bit locations by a procedure called programming. In the program mode, only one row-line is taken to +25V while all of the other row lines are held near 0V. Approximately +17V is applied to a selected column line while unselected column lines are simply left floating. For example, in FIG. 2 assume X1 and Y1 are selected by the address decoders while X2, X3, Y2 and Y3 are not selected. With X1 at +25V and Y1 at +17V, large amount of current flows through the channel 41 of T11. As a result of the large current, some negative charge is transferred through the oxide above the channel to become trapped on the transistor's floating gate 40. Because X2 and X3 are near 0V, transistors T21, T22, T23, T31, T32, and T33 are not conducting current; hence, no charge is trapped on the gates of those transistors. Because unselected column lines Y2 and Y3 are simply floating, the only current to flow through T12 and T13 is a possible transient discharge of capacitance on Y2 and Y3. But such a transient is not sufficient to result in appreciable charge being stored on the floating gates. Thus, only transistor T11 is left with a negatively charged floating-gate. The trapped negative charge causes the apparent threshold voltage of T11 to increase from its previous +2V value to approximately +8V.

A troublesome phenomenon called deprogramming is next described. Assume that T11 has been programmed as above. Next, if it is desired to program a 0 into a different transistor connected to the same row-line X1, e.g. T12, column line Y1 is placed in a floating condition. The +25V applied to the gate 43 of T12 is also applied to the gate 42 of T11, causing some of the previously stored charge on gate 40 to be transferred from T11's floating gate 40 to T11's second gate 42 through the oxide which separates the two gates. The undesired result is that the apparent threshold voltage of the previously programmed transistor T11 is reduced.

Read Mode

In the read mode, the selected row is taken to +5V, unselected rows to near 0V, a selected column line is connected to a sense amplifier, and unselected column lines are left floating. For example, in FIG. 2 assume that X1 has been taken to +5V, X2 and X3 to 0V, Y1 is connected to a sense amplifier, and Y2 and Y3 are floating. The addressed transistor is T11. If T11 has been erased and then never programmed, the channel of T11 is conductive because the voltage applied to the second gate is greater than the apparent threshold voltage of the transistor. However, if the transistor has been programmed to store a binary 0, the +5V applied to the second gate is not sufficient to induce a conductive channel. The sense amplifier which is connected to the column line Y1 is designed to detect whether or not the addressed transistor is conductive. As indicated in FIG. 1, the binary output of the sense amplifier is directed to an output buffer which is enabled in the read mode. The output buffer is disabled in the program mode because the pins $0_0$-$0_7$ are used as data inputs in that mode.

Bit-Check Mode

In the prior art, no means is provided whereby the voltage applied to a selected row can be directly varied over a wide range under external control while at the same time having a means to determine whether or not a column-selected transistor in that row is conductive. However, such a capability allows the apparent threshold voltage of any transistor in the programmable matrix to be measured. For example, in FIG. 2 assume that X2 and X3 are near 0V and that column-line Y1 is connected to a sense amplifier which in turn is connected to an enabled output buffer. Under external control, the voltage on selected row X1 is slowly ramped positively from a value near 0V toward +15V. When the applied voltage is equal to the apparent threshold voltage of T11, the channel of T11 becomes conductive—a condition which can be noted by observing a logic level change at the output of the output buffer. By simply changing the address in order to select a different bit and then repeating the above procedure, the apparent threshold voltage of any bit can be measured. A detailed description of the on-chip circuitry which permits such a procedure is given later.

Deprogramming Mode

Prior art circuitry is configured such that a deprogramming stress can be applied only to one row at a time. In the new deprogramming mode, however, a means is provided whereby a high positive voltage under external control may simultaneously be applied to all row-lines while at the same time all column lines are in a floating condition.

Other Modes

In addition to the read and program modes, the prior art includes other modes such as a power down mode, program verify mode, program inhibit mode, and a deselect mode. The presently preferred embodiment performs the listed modes in the same manner as in the prior art. Operation of the present invention in these modes can be understood by reference to Table 1 in conjunction with the detailed circuit diagrams which follow.

CIRCUIT IMPLEMENTATION

FIGS. 3 through 11 provide detailed circuitry to implement the presently preferred embodiment of the invention. For maximum clarity, some portions of the circuitry are shown in detailed transistor form whereas other portions are shown in logic form. Table 1 provides a useful reference for more easily understanding the state of internal and external signals for each mode of operation. In Table 1, $\overline{OE}$ and $\overline{CE}$/PGM are external control inputs to the PROM. $V_{PP}$ is both a power supply voltage and a control input. For all modes of operation, $V_{cc}$ is a power supply voltage of +5V. Key internal signals are PU (power-up), R (read), ID (input disable), $V_p$ (a logic signal derived from $V_{pp}$), and CS (chip select). Whereas the external input signals in Table 1 are listed according to nominal voltage levels, the internal signals are listed according to logic levels, a 1 corresponding to +5V and a 0 to a voltage near 0V. The $V_{pp}$ value designated as $V_{trip}$ refers to the input switching point of control circuitry which is driven by $V_{pp}$. $V_{trip}$ typically has a value of approximately +15V. In the Figures, the output of each logic gate symbol is assumed to switch between +5 V and 0V. Also, N-channel positive logic is assumed in the Figures. For example, a two-input NAND gate is comprised of two driver transistors connected in series plus a load transistor whereas a two-input NOR gate is comprised of two driver transistors connected in parallel plus a load transistor. All load transistors of the logic gates are depletion-mode transistor which allow the outputs to pull all the way up to the supply voltage. One skilled in the art will understand that an ordinary logic function can often be implemented in various ways. For example, a simple inverter can be implemented with four transistors connected in a push-pull arrangement. The choice of an implementation often depends on the specific topological layout of the integrated circuit because different topologies result in different amounts of capacitance which must be driven.

TABLE I

| MODE | EXTERNAL SIGNALS | | | INTERNAL SIGNALS | | | | | OUTPUT BUFFERS |
|---|---|---|---|---|---|---|---|---|---|
| | $\overline{OE}$ | $\overline{CE}$/PGM | $V_{pp}$ | PU | R | ID | $V_p$ | CS | |
| Deselect | 5V | 0V | 5V | 1 | 1 | 1 | 0 | 0 | Disabled |
| Read | 0V | 0V | 5V | 1 | 1 | 1 | 0 | 1 | Enabled |
| Power Down | 0V | 5V | 5V | 0 | 1 | 1 | 0 | 0 | Disabled |
| Program | 5V | 0V | 25V | 1 | 1 | 1 | 1 | 0 | Disabled |

TABLE I-continued

| MODE | EXTERNAL SIGNALS | | | INTERNAL SIGNALS | | | | | OUTPUT BUFFERS |
|---|---|---|---|---|---|---|---|---|---|
| | $\overline{OE}$ | $\overline{CE}$/PGM | $V_{pp}$ | PU | R | ID | $V_p$ | CS | |
| Inhibit Program | 5V | 5V | 25V | 1 | 0 | 0 | 1 | 0 | Disabled |
| Program Verify | 0V | 0V | 25V | 1 | 1 | 1 | 1 | 1 | Enabled |
| Bit-Check | 0V | 25V | <$V_{trip}$ | 1 | 0 | 1 | 0 | 1 | Enabled |
| Deprogramming | 0V | 25V | >$V_{trip}$ | 0 | 0 | 1 | 1 | 0 | Disabled |

NOTES:
1. Vcc = +5V in all modes.
2. The voltages listed for external input signals represent nominal values. Where 0V is listed for $\overline{OE}$ or for $\overline{CE}$/PGM, an input voltage in the range of −0.1V to +0.8V is normally appropriate.

Similarly, where 5V is listed for $\overline{OE}$ or for $\overline{CE}$/PGM, an input voltage in the range of +2.0V to Vcc + 1V is normally appropriate. Where 5V is listed for Vpp, a value in the range of Vcc ± 0.6V is normally appropriate.

Control Circuitry

Figure 3:
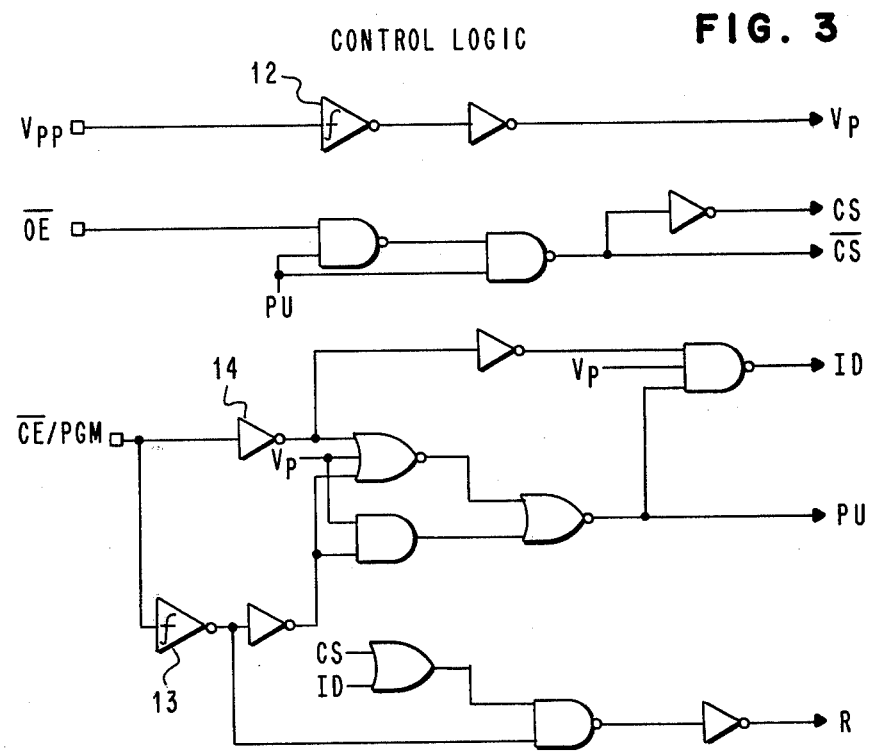
FIG. 3 is a logic diagram of the control logic of FIG. 1.

The control logic of FIG. 3 performs the function defined in Table 1. One point which warrants special note is that gates 12 and 13 have a very high switching theshold, on the order of +15 V; that is, to cause the output to transition from +5V to near 0V requires at least +15V on the input. This is accomplished simply by making the width-to-length ratio (W/L) of each inverter's driver transistor much smaller than that of the inverter's load transistor. The switching thresholds of all of the other gates, though, are typically in the range of 1.4V to +2.5V (with the exception of gates 12 and 13, the switching threshold of each gate which has an external input is typically near +1.4V in order to respond to standard TTL input voltages). It should be observed that this arrangement gives rise to a type of tri-level control on the $\overline{CE}$/PGM input. When the external voltage applied to $\overline{CE}$/PGM is near 0V, the output of each of inverters 13 and 14 is at a logic 1. When $\overline{CE}$/PGM is near +5V, the output of inverter 14 is a logic 0, but the output of inverter 13 is a logic 1. Firstly, when CE/PGM is near +25V, the output of each inverter is a logic 0. The utility of each of the generated control signals will become apparent in the subsequent discussions of other functional portions of the integrated circuit.

A0 Address Buffer

Circuitry for the A0 address buffer of FIG. 1 is shown in FIG. 4. All transistors which have a "D" prefix are N-channel depletion-mode transistors, whereas those with a "T" prefix are enhancement-mode transistors. As seen in Table 1, in most operating modes the signal PU is a logic 1, thus enabling the circuitry of FIG. 4. However, to save power in the power down mode, PU is taken to logic 0, thus turning off transistors T2 and T5.

In the program mode and bit-check mode, R is near 0V and the inverters are enabled (PU being at +5V). If input A0 is near 0V, circuit node 15 will be at +5V while circuit node 16 will be close to 0V. The W/L of depletion-mode transistor D6 is made much larger than that of transistor D7 so that the effective ON resistance of D6 is much less than that of D7. With the gate of D6 at 0V (signal R), the source at 0V (node 16), and D6 being a depletion-mode transistor with a large W/L, signal A0B will be near 0V, even though $V_{pp}$ may be at +25V. Signal $\overline{A0B}$, however, will track very closely to the value of $V_{pp}$ (at least over the range of voltage where $V_{pp}$ exceeds the pinch-off voltage of transistor D2). Assume, for example, that D2 has a pinch-off voltage of −2V. So long as $V_{pp}$ is greater than $\nabla 2V\nabla$, transistor D2 is turned OFF (the gate voltage of 0V being at least 2 volts more negative than the other terminals of the transistor).

If input A0 IS NEAR +5V and the inverters are enabled, an analogous description applies, but $\overline{A0B}$ will be near 0V and A0B will track $V_{pp}$.

A1-A3 and A5-A10 Address Buffers

The circuit diagram for these buffers is identical to that of the A0 address buffer of FIG. 4 except that the outputs are taken directly from the equivalent of nodes 15 and 16 and transistors D2, D3, D6 and D7 are omitted. This simplification is possible because the outputs need not track $V_{pp}$.

A4 Address Buffer

Address buffer A4, shown in FIG. 5, is somewhat different from the other buffers for a reason that will be made clear in the below discussion of the row decoder. Note that inverters 17 and 18 are not disabled by PU when PU goes to a logic 0 in the power down mode and in the deprogramming mode. Instead, in these modes, the outputs of both $\overline{A4B}$ and A4B are near 0V—regardless of the state of input signal A4.

Row Decoder

The circuit diagram of a portion of the row decoder of FIG. 1 is illustrated in FIG. 6. This figure shows the driver for two of the 128 rows. The complete row decoder is comprised of an additional 63 of such circuits, but with each having different connections to the A5B through $\overline{A10B}$ address lines in region 19. Although a simpler NOR-type decoder could be used, the row decoder of FIG. 6 conserves integrated circuit chip area by utilizing a "virtual" ground. In all modes except the power down mode and the deprogramming mode, either transistor T8 or T9 is turned ON—causing the corresponding node 20 or 21 to be at a voltage close to 0V, thereby establishing a virtual ground for the decode transistors such as T6 or T7 in region 19. For example, assume that $\overline{A4B}$ is at +5V, A4B at 0V, and $\overline{A5B}$ is at +5V. Because T9 is turned ON, node 21 is near 0V, establishing virtual ground. With T7 turned ON, node 20 will also be near 0V. Similar to the above-described A0 address buffer, the W/L's of transistors D9 and D12 are made much larger than the W/L's of D10 and D13. With nodes 20 and 21 near 0V, outputs X1 and X2 will both be near 0V (regardless of whether R is at +5V or 0V); consequently, neither row is selected. But if in the example the address lines $\overline{A5B}$–$\overline{A10B}$ were such that the six transistors in region 19 were all turned OFF, node 20 would be at +5V rather than at 0V. If R is at 0V (as in the program, bit-check, and deprogram modes), the output X1 will track very closely to the value of $V_{pp}$ (provided $V_{pp}$ is at a value greater than the pinch-off voltage of D9). If R were at +5V while node 20 was at +5V, the X1 output would be unable to closely track with $V_{pp}$; instead, the output would remain close to +5V even as $V_{pp}$ was increased to +25V.

From Table 1 it can be observed that the internal control signals PU, ID, $V_p$, ID and CS during the bit-check mode are identical to those internal signals during the read mode; only signal R is different (to allow the selected row line to track $V_{pp}$). Also note that the output of a selected column can be observed at the appropriate output pin.

Only in the power down mode and the deprogram mode are transistors T8 and T9 both turned OFF (recall the above discussion of the A4 address buffer). Both are turned OFF in the power down mode to conserve power, and in the deprogram mode both are turned OFF to allow all row outputs to simultaneously track $V_{pp}$ (independent of region 19 address inputs).

Column Decoder

Figure 7:
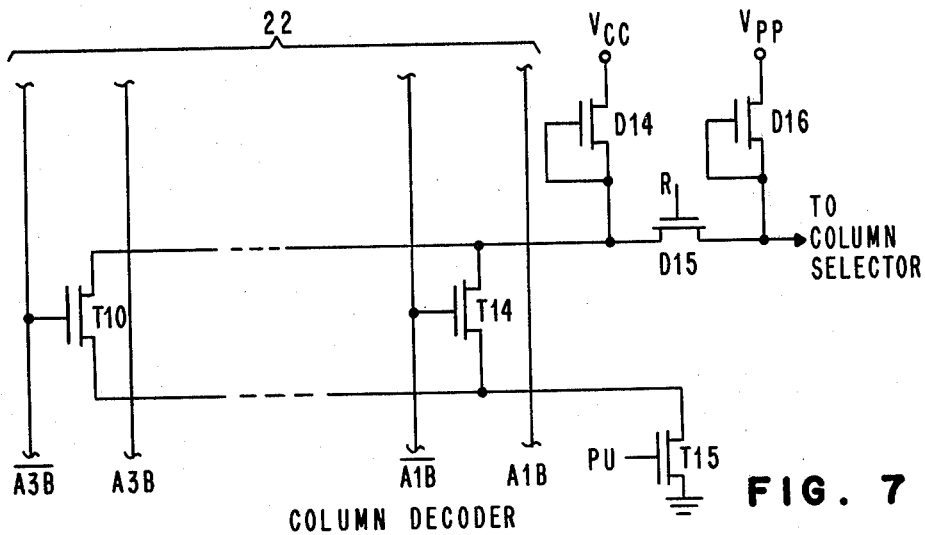
FIG. 7 is a circuit diagram of the column decoder of FIG. 1.

The circuit diagram of a portion of the column decoder of FIG. 1 is shown in FIG. 7. The decoder is comprised of eight of the circuits of FIG. 7. In order to form a 1-of-8 decoder, each of the circuits has different connections to the A1B through A3B lines in region 22. Load circuitry comprised of transistors D14, D15 and D16 functions in the same manner as described for the A0 address buffer. As can be seen in Table 1, the decoder is disabled in the power down mode by letting PU be a logic 0 (that PU is a 0 in the deprogramming mode is inconsequential so far as the column decoder is concerned).

Column Selector

Figure 8:
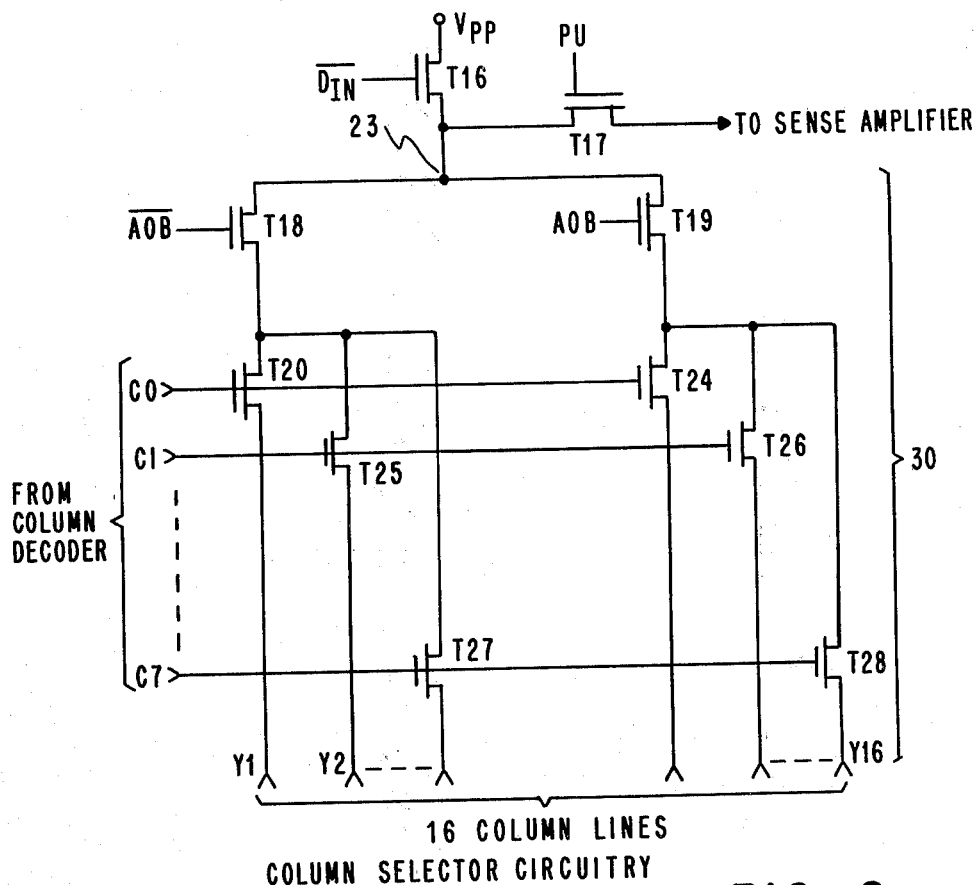
FIG. 8 is a circuit diagram of a portion of the column selector of FIG. 1.

A portion of the circuitry for the column selector of FIG. 1 is shown in FIG. 8. The circuitry of FIG. 8 allows the selection of one-of-sixteen column lines. (Because the integrated circuit is organized "X8," the circuitry of FIG. 8 is replicated 8 times in order that eight columns can be simultaneously selected.) The selected column line is connected through the multiplexer or decoder tree 30 to node 23. The signal $\overline{D_{IN}}$ is from a data input buffer. As will be more clearly seen later, $\overline{D_{IN}}$ is allowed to go positive so as to turn on enhancement-mode transistor T16 only if the integrated circuit is in the programming mode and a logic 0 is presented at the appropriate data input pin. With T16 turned ON and with $V_{pp}$ at +25V, approximately +17V will be applied to the selected column line, causing the proper row-selected floating-gate transistor to be programmed to store a binary 0. In all other modes, or if a logic 1 is presented at the data input pin, T16 is OFF.

Enhancement-mode transistor T17 is controlled by internal signal PU. In the read and bit-check modes, T17 is ON in order that the information stored in the selected location can be detected. In the deprogramming mode, both T16 and T17 are OFF, thus allowing all column lines to be simultaneously floating.

Sense Amplifier

Figure 9:
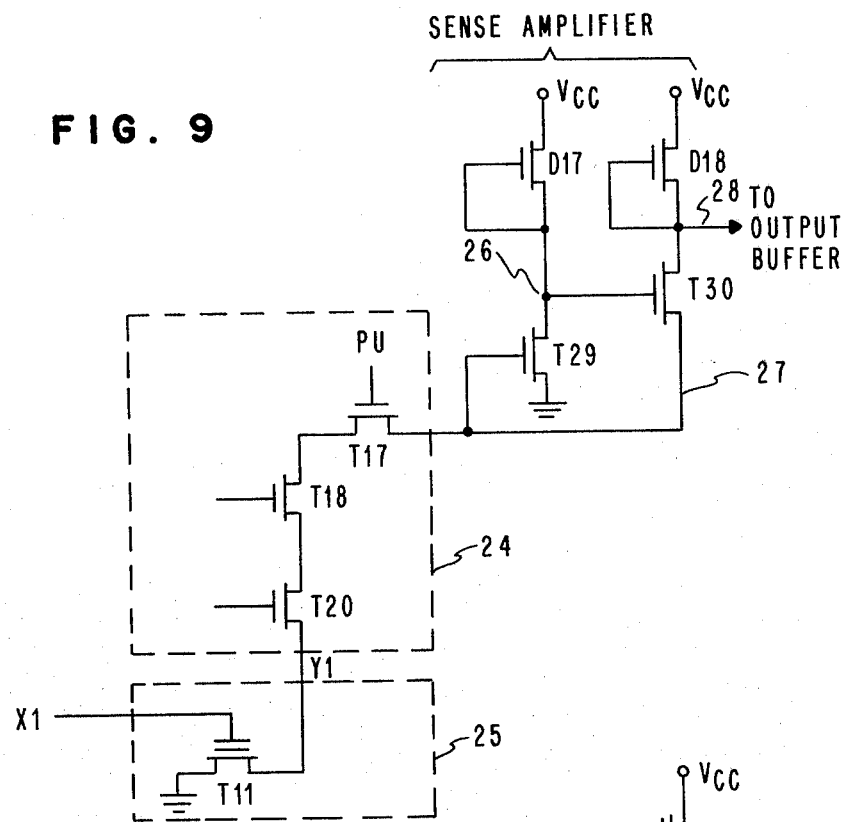
FIG. 9 is a circuit diagram of one of eight identical sense amplifiers of FIG. 1.

Sense amplifier circuitry is shown in FIG. 9. The integrated circuit contains eight such circuits, one for each output. Circuitry 24 is illustrative of a portion of the column selector of FIG. 8, and circuitry 25 is illustrative of one bit of the programmable memory matrix of FIG. 2. The sense amplifier is comprised of transistors D17, D18, T29 and T30 which are connected in a self-biasing arrangement. First, assume that the addressed memory bit comprised of transistor T11 is storing a binary 0 so that T11 is OFF. If the voltage at node 27 is less than the threshold voltage of T29, T29 will be OFF—allowing D17 to take node 26 toward the $V_{cc}$ supply of +5V. But when the voltage difference between nodes 26 and 27 exceeds the threshold voltage of T30, T30 begins to turn ON—allowing current flow through D18 and T30 to raise the voltage on node 27. The voltage on node 27 will increase until T29 is turned ON to a sufficient degree that nodes 26 and 27 reach a steady-state balance. The balance is such that T30 is slightly turned ON (to compensate for leakage current at node 27), node 27 is at the input switching point of the inverter comprised of D17 and T29, and the voltage of node 28 is close to $V_{cc}$. Thus, if there is not a reasonably conductive path to ground from node 27, the voltage at node 27 will typically be at +2V, the voltage at node 26 close to +3V (assuming at 1V threshold for T30), and the sense amplifier output will be near +5V. Next, assume that the addressed transistor T11 is ON, thereby completing a conductive path through the column selector. The voltage on node 27 will decrease, e.g. by 200 mV, causing the voltage at node 26 to increase (as determined by the gain of the inverter). As the W/L of transistor D18 is made smaller than that of T30, the voltage at node 28 will decrease to a value near that of node 27. Thus the output of the sense amplifier is either near +5V or near +2V depending upon whether the addressed bit is storing a binary 0 or a binary 1.

OUTPUT BUFFER

Figure 10:
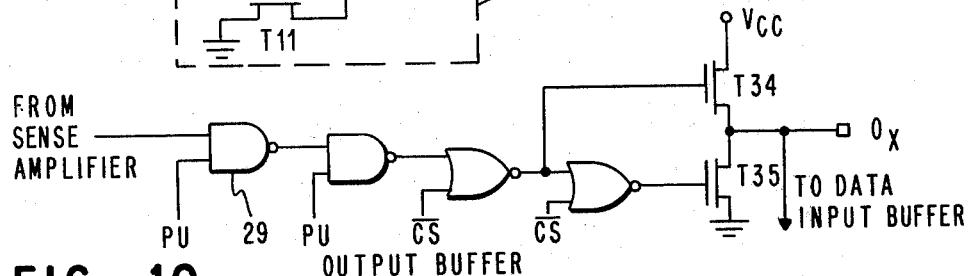
FIG. 10 is a logic and circuit diagram of one of eight output buffers of FIG. 1.

One of the eight identical ouput buffers is shown in FIG. 10. The switching threshold of logic gate 29 is designed to be compatible with the slightly reduced voltage transitions of the sense amplifier. The internal signal CS causes enhancement-mode transistors T34 and T35 to both be OFF when the integrated circuit is in any mode other than the read, program verify, or bit-check nodes (see Table 1). Thus, pins $0_0$ through $0_7$ can be used as inputs in the program mode.

DATA INPUT BUFFERS

Figure 11:
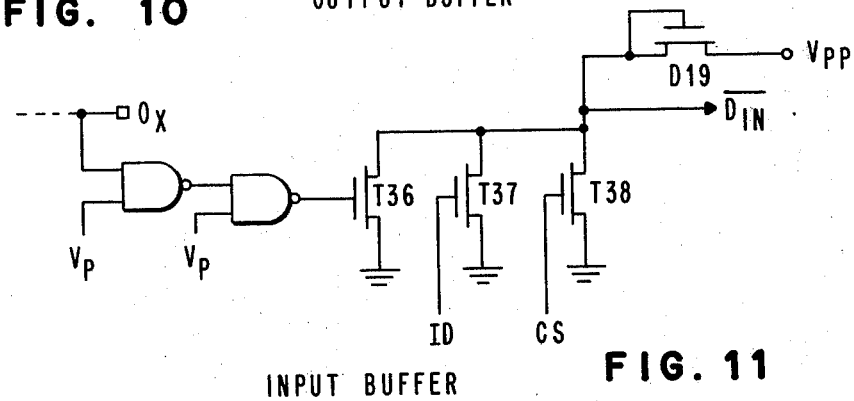
FIG. 11 is a logic and circuit diagram of one of eight data input buffers of FIG. 1.

One of the eight identical data input buffers is shown in FIG. 11. A review of Table 1 shows that signal ID is a logic 1 in all modes of operation except the program mode. Hence, in most operating modes, T37 is ON and $\overline{D_{IN}}$ is near 0V. As previsouly noted, $\overline{D_{IN}}$ is allowed to go high (with pull-up to $V_{pp}$) only when a binary 0 is to be programmed into the memory matrix.

A complete description of circuitry for a preferred embodiment of the invention has been given. Referring to Table 1, a high voltage (e.g. 25V) condition on the $\overline{CE}$/PGM input is utilized to distinguish the bit-check and deprogramming modes from the other operating modes. The $\overline{CE}$/PGM input is used in a tri-state fashion only because of a pin limitation of the integrated circuit package. One skilled in the art will appreciate that the bit-check and deprogramming modes could be distinguished in other ways; for example, by utilizing a separate control pin if a package with more pins were utilized. Assuming $\overline{OE}$ to be at 0V and $\overline{CE}$/PGM to be at +25V, when the $V_{pp}$ voltage is less than a switching point called $V_{trip}$ (approximately +15V) the integrated circuit is in the bit-check mode—allowing the apparent threshold voltage of programmable transistors to be measured over a range of approximately +2V to +15V. But when $V_{pp}$ exceeds $V_{trip}$, the circuit automatically goes into the deprogramming mode—allowing a deprogramming stress of from +15V to +25V (or even higher) to be applied.

METHOD FOR MORE RAPID PROGRAMMING

As mentioned, in the prior art, PROMs are normally programmed for a much longer time than is actually necessary. A more expeditious method of the present invention is to program each bit for a short time, 3 msec for example, instead of the normal 50 msec. After programming, the bit-check mode is then utilized to determine whether or not the apparent threshold voltage of each programmed transistor exceeds a predetermined value, e.g. +7V. If so, the programming is complete. If not, the 3 msec programming plus bit-check procedure is repeated as many times as one desires. The time required to perform the bit-check on the entire array depends primarily on the size of the array and the read access time. For a 2048×8 array and typical read access time of 0.5 msec, the entire array can be measured in slightly over 1 msec. Becasue eight bits can be programmed at a time, the total time to program such an array by the method of the present invention is slightly over 6 seconds compared to more than 100 seconds by the prior art method.

METHOD FOR MORE RAPID AND MORE THOROUGH TESTING

The testing of a PROM necessitates the programming of the PROM. If the programming time is reduced per the above discussion, the total time to test is inherently reduced.

But in addition to the above time savings, the following procedure also saves test time while providing the benefits of a more thorough test than is utilized in the prior art. First, an erased circuit is programmed to have binary 0's in all bits. Next, the integrated circuit is placed in the deprogramming mode with, for example, +25V applied to $V_{pp}$. The circuit is held in the deprogramming mode for a predetermined time, 750 msec for example. (As will become clear later, 750 msec is a rational choice because it is equivalent to the prior art total time of deprogramming stress which would be applied to the first of sixteen bits, where each of the sixteen bits is sequentially programmed to a 0 for 50 msec each, and where the sixteen bits are in the same row and are associated with the same column selector.) Finally, the integrated circuit is placed in the bit-check mode and the apparent threshold voltage of each programmable transistor is determined. The determination can be the actual measurement of each transistor's apparent threshold or can simply be a determination of whether the apparent threshold of each 0-storing transistor exceeds a desired value. The above procedure reduces the time required in the prior art to subject each bit to a fairly uniform deprogramming stress.

For the above-given procedure, consider the total deprogramming time applied to each bit. The act of programming all 0's in the array causes some bits to be stressed more than others. For each group of 16 bits associated with a column selector like that of FIG. 8, assume that addresses are applied such that the left-most bit is programmed first, then the next-to-left-most bit, etc., and finally the right-most bit. The left-most bit will receive 15 deprogramming stress periods, the next-to-left-most will receive 14, and so on. But the right-most bit receives no deprogramming stress. If the time alloted to initially program each bit to a 0 was 3 msec, then the left-most bit has received 45 msec of programming stress, the next-to left-most has received 42 msec, and so forth. Then, after all bits have been simultaneously subjected to a 750 msec stress in the deprogramming mode, each bit will have been subjected to a total deprogramming stress of from 750 to 795 msec. The total time to accomplish the stress is the time required to write 0's everywhere plus 750 msec.

Compare the above time, though, to the time required by prior art methods to accomplish a comparable, reasonably-uniform stress of the bits. As before, assume that a group of sixteen bits in a row are sequentially programmed to 0's in a left-most to right-most order. If the time alloted to program each bit is 50 msec, the left-most bit will recieve 15 deprogramming stress periods for a total of 750 msec. But each succeeding bit receives 50 msec less stress than the one before. The last bit of the sixteen receives no deprogramming stress. At first glance, it might erroneously appear that a uniform stress could be achieved by programming 0's everywhere and then immediately programming 0's again but in the reverse address order. However, the stresses which are relevant to a given bit are those which occur after that bit has last been programmed to a 0. Consider the left-most bit, for example. At the end of the above twice-programming procedure the left-most bit is the last to be programmed to a 0. After the left-most bit has been programmed to a 0 for the second time, it receives no deprogramming stresses. A correct procedure to accomplish a meaningful uniform stress would be as next described. After erasing, 0's are programmed everywhere, starting with the left-most bit in each similarly situated group of sixteen bits. The integrated circuit is then tested to determine if each left-most bit still contains a 0. The integrated circuit is then erased again, and 0's are again programmed everywhere, but this time starting with the next-to-left-most bits. The circuit is then tested a second time to determine if the next-to-left-most bits still contain 0's. The procedure is repeated until the right-most bits have been tested. The time required to perform such a procedure is greater than sixteen times the sum of the time required to write 0's everywhere plus the time required to erase the circuit. The time required to write 0's everywhere in a 2048×8 PROM is typically 102.4 seconds (at 50 msec per 8-bit byte). The time required to erase an ultraviolet erasable PROM is typically twenty minutes. The total time, then, required to perform the above procedure on an ultraviolet erasable PROM exceeds five hours. But five hours is prohibitively long from an economic viewpoint. Consequently because the test is normally not performed, the prior art testing is normally less thorough than that of the present invention. (In some types of PROMs, the erasing can be accomplished by electrical means in a much shorter time than the twenty minutes typically required for an ultraviolate erasable PROM. Even with these PROMs, the time required to perform the deprogramming test by prior art methods is normally also regarded as prohibitively long.)

The procedure of the present invention not only can save test time, but also, at the conclusion of the stress, the apparent threshold voltage is determined, thus providing significantly more information regarding the effect of the stress than is possible in the prior art.

Although preferred embodiments of the present invention have been described in detail, it is to be understood that various changes, substitutions and alterations may be made therein without departing from the spirit and scope of the invention as defined by the appended claims.

What is claimed is:

1. In a programmable digital read only memory integrated circuit having a programmable memory matrix containing a plurality of programmable transistors, the improvement comprising circuit means for coupling a variable voltage to the gate of each programmable transistor and means for detecting if the threshold voltage of each programmable transistor within the programmable memory matrix has been reached.

2. A programmable read only memory having a programmable memory matrix containing a plurality of programmable transistors comprising:
   (a) addressing means connected to the programmable memory matrix for selecting any particular programmable transistor within the programmable memory matrix;
   (b) circuit means at least partially contained within the addressing means for applying a variable voltage under external control between the control gate and source and drain of the addressed programmable transistor; and
   (c) circuit means connected to the addressing means for detecting whether or not the channel of the addressed programmable transistor is conductive upon application of the variable voltage, whereby the apparant threshold voltage of the addressed programmable transistor may be determined.

3. The circuitry of claim 2 wherein the addressing means is comprised of:
   (a) a 1-of-N row decoder, where N is the number of rows of the programmable memory matrix; and
   (b) a column selector for selecting a particular column from a plurality of columns.

4. The circuitry of claim 3 wherein the circuit means for detecting whether or not the addressed transistor is conductive is connected to the output of the column selector.

5. The circuitry of claim 3 wherein the outputs of the 1-of-N row decoder are adapted to receive the variable voltage for application to the control gate of the addressed transistor.

6. In a programmable read only memory having a programmable memory matrix containing a plurality of programmable transistors, the improvement comprising circuit means coupled to the programmable memory matrix for simultaneously applying a voltage stress between the control gate and source and drain of each programmable transistor within the programmable memory matrix.

7. A programmable read only memory integrated circuit having a programmable memory matrix containing a plurality of transistors comprising:
   (a) circuit means for simultaneously applying a voltage stress between the control gate and source and drain of each transistor within the programmable memory matrix; and
   (b) circuit means for preventing current flow, other than leakage current, through the channels of the transistors within the programmable memory matrix during the time that the voltage stress is applied.

8. The circuit means of claim 7 wherein the circuit means for simultaneously applying a voltage stress between the gate and source and drain of each transistor within the programmable memory matrix utilizes the outputs of a row decoder for application of the voltage stress to the gates of the transistors.

9. A method of programming a digital programmable read only memory integrated circuit having a memory matrix containing a plurality of programmable transistors, comprising the steps in sequence set forth:
   (a) programmable at least a portion of the memory matrix of said integrated circuit;
   (b) coupling a variable voltage to the gate of a programmable transistor;
   (c) detecting if the apparant threshold of the programmable transistor has been reached; and
   (d) repeating steps (a), (b) and (c) until a desired apparant threshold voltage result is achieved, but with a predetermined maximum number of attempts.

10. A method of testing a programmable read only memory integrated circuit having a memory matrix of transistors, comprising the steps in the sequence set forth:
   (a) programming at least a portion of the transistors of the memory matrix of said integrated circuit;
   (b) applying a voltage stress simultaneously to the transistors which comprises the portion of the memory matrix which has been programmed; and
   (c) determining the apparent threshold voltage of the transistors which comprise the portion of the memory matrix which has been programmed.

* * * * *